M(12) United States Patent
Rho et al.

(10) Patent No.: US 7,751,303 B2
(45) Date of Patent: Jul. 6, 2010

(54) DEMODULATION CIRCUIT FOR USE IN RECEIVER USING IF DIRECTING SAMPLING SCHEME

(75) Inventors: Shi-chang Rho, Suwon-si (KR); Kwang-chul Kim, Seoul (KR); Jeong-taek Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 645 days.

(21) Appl. No.: 11/356,028

(22) Filed: Feb. 17, 2006

(65) Prior Publication Data

US 2006/0209988 A1 Sep. 21, 2006

(30) Foreign Application Priority Data

Feb. 18, 2005 (KR) .................. 10-2005-0013752

(51) Int. Cl.
*H04B 1/16* (2006.01)
(52) U.S. Cl. .................. 370/200; 370/310; 370/315; 370/316; 370/345; 370/350; 329/315; 329/345; 329/316; 455/130; 455/313; 455/323; 455/334; 455/337
(58) Field of Classification Search .................. 370/200; 375/316; 455/130, 313, 323, 324; 329/315–346
See application file for complete search history.

(56) References Cited

U.S. PATENT DOCUMENTS 4,680,810 A * 7/1987 Swartz .................. 398/197

| 6,243,430 | B1 | 6/2001 | Mathe | |
| 6,282,413 | B1 | 8/2001 | Baltus | |
| 6,400,679 | B1 * | 6/2002 | Suzuki | 370/208 |
| 6,532,273 | B1 * | 3/2003 | Mobin et al. | 375/350 |
| 2003/0021367 | A1 * | 1/2003 | Smith | 375/346 |
| 2003/0076899 | A1 * | 4/2003 | Kumar et al. | 375/316 |
| 2003/0165202 | A1 | 9/2003 | Park | |
| 2004/0066736 | A1 * | 4/2004 | Kroeger | 370/200 |
| 2004/0137869 | A1 * | 7/2004 | Kim | 455/324 |
| 2004/0264602 | A1 * | 12/2004 | Lewis | 375/324 |

OTHER PUBLICATIONS

Harris F:, "Multirate digital filters used for timing recovery in digital receivers", Signals, Systems and Computers, 2000. Conference Record of the Thirty-Fourth Asilomar Conference on Oct. 29-Nov. 1, 2000, Piscataway, NJ, USA, IEEE, vol. 1, Oct. 29, 2000, pp. 246-251, XP010535370.

\* cited by examiner

*Primary Examiner*—William Trost, IV
*Assistant Examiner*—Charles C Jiang
(74) *Attorney, Agent, or Firm*—Sughrue Mion, PLLC

(57) ABSTRACT

Disclosed is a demodulation circuit for demodulating an IF signal which is input via an antenna and then over-sampled at a sampling rate four times a frequency of a baseband signal, the demodulation circuit including a mixer for converting the IF signal down to a baseband signal using a coefficient corresponding to either sine values or cosine values, a DEMUX for dividing the down-converted baseband signal into a plurality of signals, and a PPF having a plurality of sub-filters for filtering the divided signals input from the DEMUX and a plurality of adders for operating the output signals of the sub-filters. As a result, the demodulation circuit can be realized in a small hardware size and is capable of reducing power consumption.

7 Claims, 3 Drawing Sheets

DEMODULATION CIRCUIT FOR USE IN RECEIVER USING IF DIRECTING SAMPLING SCHEME

This application claims priority from Korean Patent Application No. 2005-13752, filed on Feb. 18, 2005, the entire content of which is incorporated herein by reference.

BACKGROUND OF THE INVENTION

1. Field of the Invention

Apparatuses consistent with the present invention relate to a demodulation circuit for use in a receiver, and more particularly, to a demodulation circuit for a receiver, which has a small hardware size and consumes low power.

2. Description of the Related Art

Generally, a heterodyne receiver does not directly modulate a carrier frequency signal to a baseband frequency signal. Rather, the heterodyne receiver has a system which converts an incoming signal to an intermediate frequency (hereinafter referred to as "IF") signal between a carrier frequency and a baseband frequency, for processing. Such heterodyne receiver can down-convert the IF signal to the baseband signal, demodulate the baseband signal and then digitize the demodulated signal. Otherwise, the heterodyne receiver can directly digitize the IF signal to a digital signal and then demodulate the digitized signal. The latter method is called an IF direct sampling.

FIG. 1 illustrates a block diagram of a receiver using an IF direct sampling method in accordance with a related art. As shown in FIG. 1, an IF direct sampling type receiver in accordance with a related art includes an RF tuner 10, a "Surface Acoustic Wave filter" 15 (hereinafter referred as "SAW filter"), an IF amplifier 20, an A/D converter 25, a demodulation circuit 30 and a signal processing block 50.

The RF tuner 10 receives an RF signal via an antenna in synchronization with a frequency of the RF signal and converts the received RF signal to an IF signal.

The SAW filter 15 is a communication filter using mechanical vibrations of a piezo-electric substrate. In case that an electrical signal is input to the SAW filter 15, surface acoustic wave occurs over the piezo-electric substrate and it is converted to an electrical signal again. At this time, if a frequency of the surface acoustic wave and a frequency of an incoming electrical signal are different, the incoming signal can not be transferred. That is, only the desired frequency signals can pass through the SAW filter 15.

The IF amplifier 20 amplifies an output signal of the SAW filter 15 so as to keep the level of a signal to be input to the A/D converter 25 constant.

The A/D converter 25 converts the IF signal to the digital signal and receives a clock signal at a frequency equal to 4 times the baseband sample frequency from a clock generator during the digital signal conversion.

The demodulation circuit 30 for demodulating the digitalized IF signal includes a pair of mixers 35, a pair of "low-pass filters" 40 (hereinafter referred as "LPF"), and a pair of down sampling units 45.

The mixer 35 down-converts the IF signal to the baseband level by combining the IF signal output from the A/D converter 25 with a sine wave or a cosine wave at the same frequency as the IF signal.

A pair of the LPFs 40 filters the down-converted IF signal to eliminate high frequency signals and eliminates noises in a stopband. At this time, the LPF 40 should operate four times faster than general LPFs since the sampled signals input to the LPFs 40 have a frequency four times greater than the baseband signals.

The down sampling unit 45 selects desired samples out of the IF signals output from the LPFs 40, performs 4 times of sampling operations in one period and outputs "Inphase" signals (hereinafter referred as "I") and "Quardrature" signals (hereinafter referred as "Q").

The receiver described above down-converts the IF signals digitized by the A/D converter 25 to the baseband signals using a sine and a cosine waves to produce the I signals and Q signals. Accordingly, a pair of the mixers 35 are needed to receive the sine and cosine waves and a pair of the LPFs 40 are needed to eliminate noises in the signals down-converted to the baseband. Therefore, the receiver is disadvantageous in that it has a large hardware size because it needs pairs of the mixers and the LPFs, and the cost is high due to the large hardware size.

Further, in the receiver described above, the LPFs 40 should operate four times faster than general LPFs to filter the IF signal since it is sampled at a sampling rate four times greater than the baseband signal frequency. Accordingly, the receiver has a drawback in that it consumes much power since the LPFs 40 operate at high speed.

Accordingly, it is demanded that the receiver should be realized in a small size by reducing the number of mixers 35 and LPFs 40 provided in pairs, respectively in the receiver in accordance with the related art. Further, it is demanded that power consumption be reduced by lowering the operational speed of the LPF 40 when the LPF 40 processes the high frequency IF signals produced by the A/D converter 25.

SUMMARY OF THE INVENTION

A feature of the present invention is to provide a demodulation circuit for a receiver, which can be realized in a small hardware size and consumes low power.

In order to achieve a feature of the present invention, there is provided a demodulation circuit for demodulating an IF signal at a frequency four times a frequency of a baseband signal, the IF signal being formed by over-sampling an incoming signal input via an antenna at a sampling rate four times a frequency of the incoming signal, including a mixer for converting an IF signal down to a baseband signal using coefficient corresponding to either sine values or cosine values, a DEMUX for dividing the down-converted baseband signal into a plurality of signals, and a polyphase filter (PPF) having a plurality of sub-filters for filtering the divided signals input from the DEMUX and a plurality of adders for operating the output signals of the sub-filters.

As the coefficient to be given to the mixer, a repeating pattern of an alternate arrangement of the value +1 and the value −1 may be used.

In case that the coefficient is a pattern with values in which the values are in order of "+1, −1, −1, +1, +1, −1, −1, +1, . . . ", the coefficient may correspond to cosine values, and in case that the coefficient is a pattern with values in which the values are in of "−1, −1, +1, +1, −1, −1, +1, +1, . . . ", the coefficient may correspond to sine values.

The sub-filter may include first to fourth sub-filters receiving the respective signals divided by the DEMUX.

The adder may include a first adder for adding output signals of the first and the third sub-filters, a second adder for adding output signals of the second and the fourth sub-filters; a third adder for adding output signals of the first adder and the second adder; and a fourth adder for subtracting the output signal of the first adder from the output signal of the second adder.

Additionally, an inverter may be further applied to at least one output terminal of the third adder and the fourth adder, and serve as a bypass of the output terminal for inverting a state of output signal of the connected output terminal. Also, a MUX may be further provided, for selectively outputting an output signal of the inverter and an output signal of one of the third and fourth adders.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE EXEMPLARY EMBODIMENTS

Certain embodiments of the present invention will be described in greater detail with reference to the accompanying drawings.

In a general receiver using an IF direct sampling scheme, an A/D converter simply digitizes an IF signal and provides the digitized IF signal to a demodulation circuit. Meanwhile, an A/D converter in a demodulation circuit in accordance with the present invention not only digitizes an IF signal but also provides a digitized signal in response to a clock signal at a frequency four times a frequency of a baseband signal to a demodulation circuit.

Figure 1:
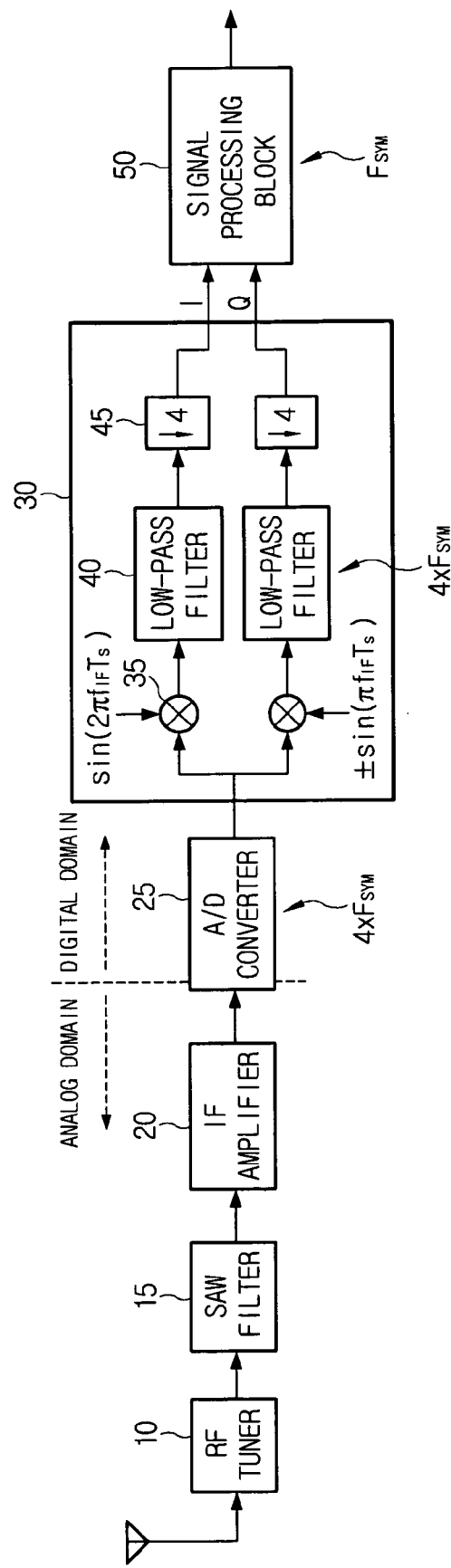
FIG. 1 is a block diagram of a receiver which uses an IF direct sampling scheme, in accordance with a related art.
Figure 2:
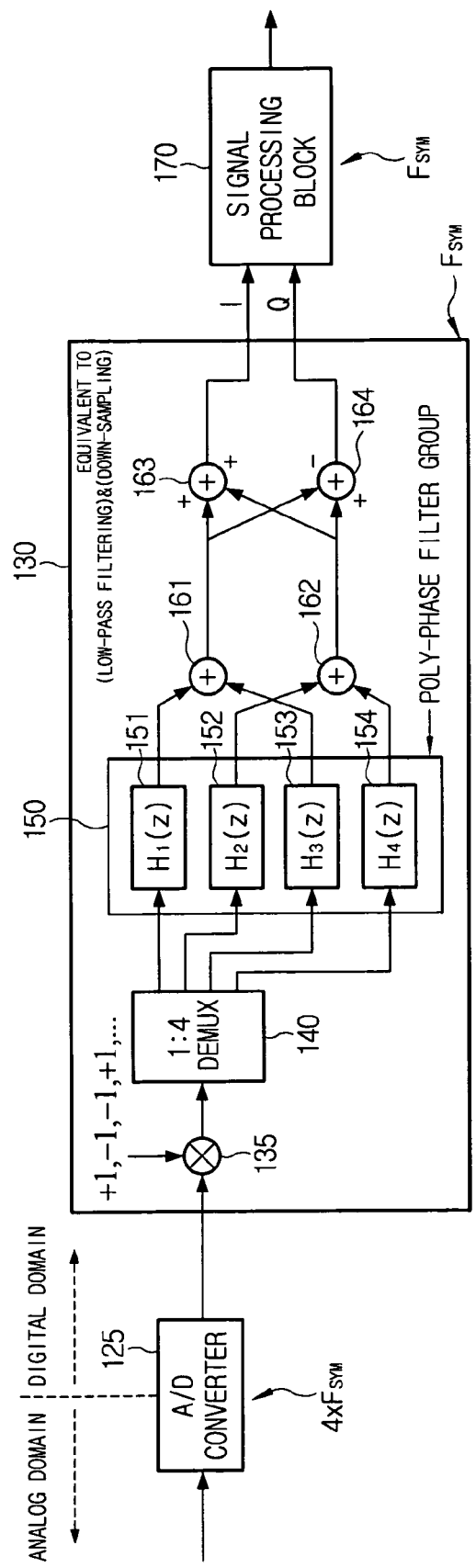
FIG. 2 is a block diagram of a demodulation circuit using an IF direct sampling scheme, in accordance with one embodiment of the present invention.

FIG. 2 illustrates a block diagram of a demodulation circuit for use in a receiver using an IF direct sampling scheme, in accordance with one embodiment of the present invention.

A demodulation circuit 130 includes a mixer 135, a DEMUX 140, a polyphase filter (PPF) 150, and an LPF comprised of a plurality of adders.

The mixer 135 receives a coefficient corresponding to the sine values or the cosine values from a local oscillator, and performs down-conversion with respect to an IF signal sampled by an A/D converter 125 at a sampling rate four times a frequency of an incoming using the given coefficient to a baseband signal. At this time, the coefficient for use in the down-conversion is expressed as follows since a sine wave used for the down-conversion has a frequency equal to a quarter of an incoming signal frequency:

values of a cosine wave: 0.7071×(+1, −1, −1, +1, +1, −1, −1, +1, ... )

values of a sine wave: 0.7071×(−1, −1, +1, +1, −1, −1, +1, +1, ... )

Here, even-numbered values of the cosine wave and the sine wave are the same but odd-numbered values of the cosine wave and the sine wave are in the opposite phase. However, such relationship between the cosine values and the sine values can be inverted by a modulation provided in a receiver.

Meanwhile, a signal output from the mixer 135 is divided into four signals by a DEMUX 140, and then the output signals of the DEMUX 140 are input to the one PPF 150. Then, the PPF 150 processes the four incoming signals using adders, thereby generating an I signal and a Q signal. Since this receiver includes only one mixer 135, the mixer 135 receives the coefficient corresponding to the values of either the cosine wave or the sine wave. That is, the mixer can receive the coefficient corresponding to the cosine values having a pattern constituted by repeating the values in order of "+1, −1, −1, +1", or receive the coefficient corresponding to the sine values having a pattern constituted by repeating the values in order of "−1, −1, +1, +1". In this embodiment, the coefficient corresponds to the cosine values.

The DEMUX 140 divides the baseband signal down-converted by the mixer 135 into four signals, and transmits them to the PPF. As a result, the respective sub-filters of the PPF 150 receive sequentially the baseband signals down-converted with the coefficient "+1, −1, −1, +1."

The PPF 150 is a kind of an LPF and includes a first sub-filter 151, a second sub-filter 152, a third sub-filter 153 and a fourth sub-filter 154.

The transfer function H(z) of the PPF is defined by Equation 1 below.

$$H(z)=h_0+h_1z^{-1}+h_2z^{-2}+h_3z^{-3}+\ldots+h_{N-2}z^{-(N-2)}+h_{N-1}z^{-(N-1)} \quad \text{Equation 1}$$

To realize the first to fourth sub-filters 154, decomposition must be performed twice in the PPF 150. First-order decomposed transfer functions acquired by performing the decomposition once are expressed as in Equation 2.

$$H_{odd}(z^2)=h_0+h_2z^{-2}+h_4z^{-4}+\ldots+h_{N-2}z^{-(N-2)}$$

$$H_{even}(z^2)=h_1z^{-1}+h_3z^{-3}+h_5z^{-5}+\ldots+h_{N-1}z^{-(N-1)} \quad \text{Equation 2}$$

At this time, the relationship between the transfer function H(z) of the PPF 150 and first-order decomposed transfer functions, $H_{odd}(z^2)$ and $H_{even}(z^2)$, is s follows:

$$H(z)=H_{odd}(z^2)+z^{-1}H_{even}(z^2)$$

Meanwhile, in case that the first-order decomposed transfer functions, $H_{odd}(z^2)$ and $H_{even}(z^2)$, expressed in Equation 2 are decomposed, functions $H_1(z^4)$, $H_2(z^4)$, $H_3(z^4)$, and $H_4(z^4)$, which are the transfer functions of the first to the fourth sub-filters 154 and expressed in Equation 3, are acquired.

$$H_1(z^4)=h_0+h_4z^{-4}+h_8z^{-8}+\ldots+h_{N-4}z^{-(N-4)}$$

$$H_2(z^4)=h_1z^{-1}+h_5z^{-5}+h_9z^{-9}+\ldots+h_{N-3}z^{-(N-3)}$$

$$H_3(z^4)=h_2z^{-2}+h_6z^{-6}+h_{10}z^{-10}+\ldots+h_{N-2}z^{-(N-2)}$$

$$H_4(z^4)=h_3z^{-3}+h_7z^{-7}+h_{11}z^{-11}+\ldots+h_{N-1}z^{-(N-1)} \quad \text{Equation 3}$$

Here, the relationships between the first-order decomposed transfer functions and the second-order decomposed transfer functions are as follows:

$$H_{odd}(z^2)=H_1(z^4)+z^{-2}H_3(z^4)$$

$$H_{even}(z^2)=z^{-1}H_2(z^4)+z^{-3}H_4(z^4)$$

As described above, since the PPF 150 is comprised of four sub-filters and by performing two-step decomposition processes, the clock speed can be reduced to ¼ thereof, thereby preventing the PPF 150 from operating at high speed during the processing of the samples at a frequency which is increased four times by the A/D converter 125.

At output terminals of the four sub-filters, the first to fourth adders 164 are applied, respectively. The first adder 161 and the second adder 162 processes output signals of the first to the fourth sub-filters 154, and the third adder 163 and the fourth adder 164 processes the output signals of the first and the second adders 161, 162.

The first adder 161 outputs a signal by adding the output signals of the first sub-filter 151 and the third sub-filter 153. At this time, the output signals of the first sub-filter 151 and the third sub-filter 153 have the opposite values, and the first adder 161 outputs the difference between the output signals of the first sub-filter 151 and the third sub-filter 153. The second adder 162 adds the output signals of the second and fourth sub-filters 152, 154. At this time, since the output signals of the second sub-filter 152 and the fourth sub-filter 154 have the opposite values, the second adder 162 outputs the difference between the values of both output signals of the second sub-filter 152 and the fourth sub-filter 154 in the same manner as the first adder 161.

The third adder 163 generates the I signal by adding the output signals of the first adder 161 and the second adder 162, and the fourth adder 164 generates the Q signal by subtracting the output signal of the first adder 161 from the output signal of the second adder 162.

Figure 3:
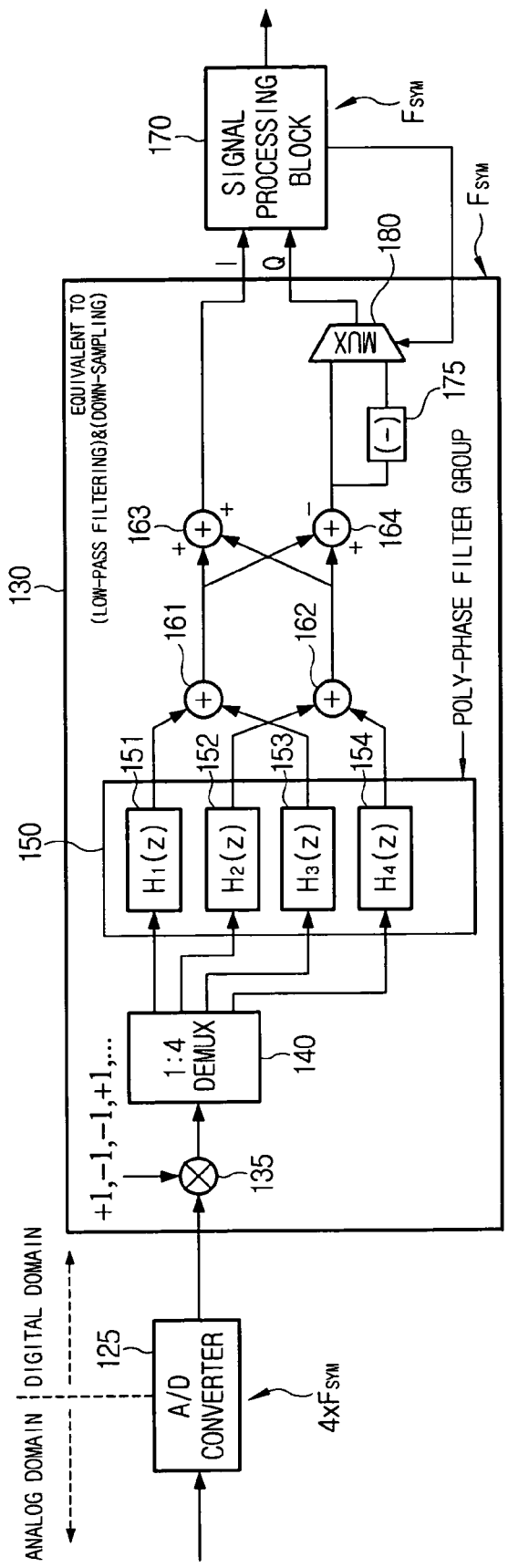
FIG. 3 is a block diagram of a demodulation circuit using an IF direct sampling scheme, in accordance with another embodiment of the present invention.

FIG. 3 illustrates a block diagram of a demodulation circuit 130 in accordance with another embodiment of the present invention. As shown in FIG. 3, the output terminal of the fourth adder 164 in the present demodulation circuit 130 is connected to an inverter 175 and a MUX 180. The inverter 175 is connected to the output terminal of the fourth adder 164, but the output signal of the fourth adder 164 also can be connected to the MUX 180 by bypassing the inverter 175. Accordingly, the MUX 180 receives the output signal of the fourth adder 164 as well as an output signal of the inverter 175. The MUX 180 directly relays the Q signal generated by the fourth adder 164 to a signal processing block 170 in response to a control signal generated by the signal processing block in which the I signal and the Q signal generated in the demodulation circuit 130 are processed, or sends an inverted Q signal, which has the opposite value of the Q signal and is made by the inverter 175, to the signal processing block 170.

Generally, when modulating a signal in a transmitter, a signal is modulated by multiplying cosine values by negative sine values therewith. In case that, a signal is modulated by multiplying a cosine value by a positive sine value, or by multiplying a negative cosine value by a negative sine value, the negative and positive states of the I signal and the Q signal can be changed. In this case, the inverter 175 corrects the states of the I signal and the Q signal by inverting the states thereof. Accordingly, the inverter 175 and the MUX 180 can be applied to the output terminal of third adder 163 as well as the output terminal of the fourth adder 164.

Whether the Q signal output from the fourth adder 164 is directly input to the signal processing block 170 or the inverted Q signal produced as the Q signal passes through the inverter 175 is inputted to the signal processing block 170 is determined at the time when the demodulation circuit 130 is designed.

As described above, since the present demodulation circuit 130 has one PPF 150 comprised of four sub-filters and one LPF comprised of four adders, the number of LPFs and mixers 135 decreases. As a result, the hardware size and cost of the demodulation circuit 130 can be reduced and as the number of components decreases. Further, since the present demodulation circuit 130 can reduce an internal clock speed of the PPF 150 by two steps of decomposition, power consumption, which has a characteristic of increasing as the LPF operates at higher speed, is reduced.

The foregoing embodiment and advantages are merely exemplary and are not to be construed as limiting the present invention. The present teaching can be readily applied to other types of embodiments. Also, the description of the embodiments of the present invention is intended to be illustrative, and not to limit the scope of the claims, and many alternatives, modifications, and variations will be apparent to those skilled in the art.

What is claimed is:

1. A demodulation circuit for demodulating an intermediate frequency (IF) signal at a frequency four times a frequency of a baseband signal, comprising:
    a single mixer which converts the IF signal down to a single baseband signal using a coefficient corresponding to either sine values or cosine values;
    a DEMUX which divides the baseband signal into a plurality of signals;
    a polyphase filter (PPF) having a plurality of sub-filters which filters the plurality of signals; and
    a first plurality of adders which operates on a part of output signals of the plurality of sub-filters;
    a second plurality of adders, each of which operates on each of the output signals of the first plurality of adders,
    wherein the IF signal is formed by over-sampling an incoming signal input via an antenna at a sampling rate four times a frequency of the incoming signal.

2. The demodulation circuit as claimed in claim 1, wherein the coefficient comprises a repeating pattern of an alternating arrangement of the value +1 and the value −1.

3. The demodulation circuit as claimed in claim 2, wherein if the coefficient comprises a pattern with values in an order of "+1, −1, −1, +I", the coefficient corresponds to cosine values, and if the coefficient comprises a pattern with values in an order of "−1, −1, +1, +1", the coefficient corresponds to sine values.

4. The demodulation circuit as claimed in claim 1, wherein the plurality of sub-filters comprises a first sub-filter, a second sub-filter, a third sub-filter and a fourth subfilter receiving the plurality of signals output by the DEMUX.

5. The demodulation circuit as claimed in claim 1, wherein the plurality of adders operates on the output signals of the plurality of sub-filters to generate an inphase signal and a quadrature signal.

6. A demodulation circuit for demodulating an intermediate frequency (IF) signal at a frequency four times a frequency of a baseband signal, the IF signal being formed by over-sampling an incoming signal input via an antenna at a sampling rate four times a frequency of the incoming signal, comprising:
    a mixer which converts the IF signal down to a baseband signal using a coefficient corresponding to either sine values or cosine values;
    a DEMUX which divides the baseband signal into a plurality of signals;
    a polyphase filter (PPF) having a plurality of sub-filters which filters the plurality of signals; and
    a plurality of adders which operates on output signals of the plurality of sub-filters,
    wherein the plurality of sub-filters comprises a first sub-filter, a second sub-filter, a third sub-filter and a fourth sub-filter receiving the plurality of signals output by the DEMUX,
    wherein the plurality of adders comprises:
    a first adder which adds an output signal of the first sub-filter and an output signal of the third sub-filter;
    a second adder which adds an output signal of the second sub-filter and an output signal of the fourth sub-filter;

a third adder which adds an output signal of the first adder and an output signal of the second adder; and a fourth adder which subtracts the output signal of the first adder from the output signal of the second adder.

7. The demodulation circuit as claimed in claim 6, further comprising:

an inverter applied to at least one of an output terminal of the third adder and an output terminal of the fourth adder, which serves as a bypass of the at least one of the output terminal of the third adder and the output terminal of the fourth adder to invert a state of an output signal of the at least one of the output terminal of the third adder and the output terminal of the fourth adder; and a MUX which selectively outputs an output signal of the inverter and one of an output signal of the third adder and an output signal of the fourth adder.

* * * * *